United States Patent

Kadosh et al.

[11] Patent Number: 5,863,818
[45] Date of Patent: Jan. 26, 1999

[54] MULTILEVEL TRANSISTOR FABRICATION METHOD HAVING AN INVERTED, UPPER LEVEL TRANSISTOR

[75] Inventors: Daniel Kadosh, Austin; Mark I. Garnder, Cedar Creek; Robert Paiz, Austin, all of Tex.

[73] Assignee: Advanced Micro Devices, Inc., Sunnyvale, Calif.

[21] Appl. No.: 727,050

[22] Filed: Oct. 8, 1996

[51] Int. Cl.⁶ .................................................. H01L 21/00
[52] U.S. Cl. .......................... 438/152; 438/153; 438/199; 438/588
[58] Field of Search .................................. 438/152, 153, 438/588, 592, 199, 426

[56] References Cited

U.S. PATENT DOCUMENTS

| 4,603,468 | 8/1986 | Lam . | |
| 4,654,131 | 3/1987 | Miller et al. . | |
| 4,686,758 | 8/1987 | Liu et al. | 437/34 |
| 5,214,295 | 5/1993 | Manning | 437/41 |
| 5,334,682 | 8/1994 | Manning et al. | 437/40 |
| 5,348,899 | 9/1994 | Dennison et al. | 437/41 |
| 5,411,909 | 5/1995 | Manning et al. | 437/52 |
| 5,616,934 | 4/1997 | Dennison et al. | 257/67 |

OTHER PUBLICATIONS

S. Wolf & R.N. Tauber, "Silicon Processing for the VLSI Era" vol. I, p. 195, 1986.
S. Wolf, "Silicon Processing for the VLSI Era" vol. II, pp. 393–399, 1990.
S. Wolf "Silicon Porcessing for the VLSI Era" vol. II, pp. 144–147, 572–581, Jun. 1990.

*Primary Examiner*—Tuan H. Nguyen
*Attorney, Agent, or Firm*—Conley, Rose & Tayon; Robert C. Kowert; Kevin L. Daffer

[57] ABSTRACT

A process is provided for producing active and passive devices on various levels of a semiconductor topography. As such, the present process can achieve device formation in three dimensions to enhance the overall density at which an integrated circuit is formed. The multi-level fabrication process not only adds to the overall circuit density but does so with emphasis placed on interconnection between devices on separate levels. Thus, high performance interconnect is introduced whereby the interconnect is made as short as possible between features within one transistor level to features within another transistor level. The interconnect achieves lower resistivity by forming a gate conductor of an upper level transistor upon a gate conductor of a lower level transistor. In order to abut the gate conductors together, the upper level transistor is inverted relative to the lower level transistor. The inverted, upper level transistor thereby comprises a gate conductor residing in an elevation level below the gate dielectric and source/drain implants of that transistor. Direct coupling of one transistor gate conductor to another transistor gate conductor not only minimizes the overall routing between those conductors for the benefit of a high performance circuit, but also is particularly attuned to inverter circuits which utilize mutually connected gate conductors.

15 Claims, 4 Drawing Sheets

MULTILEVEL TRANSISTOR FABRICATION METHOD HAVING AN INVERTED, UPPER LEVEL TRANSISTOR

BACKGROUND OF THE INVENTION

1. Field of the Invention

This invention relates to integrated circuit manufacture and more particularly to multi-level transistor fabrication and high performance interconnect arranged therebetween.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS transistor employs n-type junctions placed into a p-type substrate. Conversely, a typical p-channel MOS transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite the junction in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modern day processes employ features which have less than 1.0 $\mu$m critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefor be desirable to derive a processing technique which can produce features on more than one level. That is, it would be beneficial that this multi-level processing technique produce both active (transistors) and passive (capacitors and resistors) in three dimensions so as to enhance the overall circuit density without incurring harmful side effects associated with feature shrinkage and closeness.

Before a multi-level transistor fabrication process can be introduced, however, that process must pay careful attention to the interconnection between the transistors placed on separate levels. Therefore, it is desirable to derive an interconnect scheme which can connect various features on one elevation (topological) level to features on another level. That interconnection must be as short as possible in order to minimize resistance in critical routing conductors between transistors. The desired fabrication process must therefore incorporate not only multi-level fabrication but also high performance interconnect routing as an essential part of that process. For example, it would be desirable to incorporate a relatively short interconnect between gate conductors of a pair of transistors. For example, an inverter arrangement employs an interconnected pair of p-channel and n-channel transistor gate inputs. High performance interconnection of those inputs implies that the resistance and capacitance be as small as possible to lessen the load seen by the upstream circuit. Without a mechanism to achieve high speed interconnection, multi-level fabrication is limited in its application.

SUMMARY OF THE INVENTION

The problems outlined above are in large part solved by a multi-level transistor fabrication technique. The present technique can produce one or more active and passive devices on a first level, followed by one or more active and passive devices on a second level. The first level is substantially planar and extends across an entire wafer surface. The second level is also substantially planar and parallel to the first level, but spaced by a dielectric therefrom.

According to a preferred embodiment, a first transistor is formed on the first level and a second transistor is formed on the second level. The first and second transistors each have gate conductors which are interconnected. The gate conductor of the first transistor extends upward and has an upper surface which can be contacted by a downward extending lower surface of the second transistor gate conductor. Accordingly, the second transistor is inverted relative to the first transistor. The juncture between the first and second transistor gate conductors preferably employs a silicide. The silicide is formed upon the first level transistor polysilicon prior to depositing the second level transistor gate conductor. Silicide interposed between the gate conductors helps to reduce interconnect resistivity for the benefit of achieving a higher performance interconnect.

Importantly, interconnection of one gate conductor on top the other gate connector, with interposed silicide, achieves the benefit of a lower resistivity input conductor used, for example, in an inverter configuration. Also, the silicide allows for high quality ohmic contact between conductors especially if one conductor is doped p-type and the other n-type.

The second level transistor comprises source/drain junctions implanted into a polysilicon substrate. The polysilicon substrate is configured above the second transistor gate conductor, with a gate dielectric formed therebetween. The source/drain junctions are formed by implanting impurity species into the polysilicon in regions removed of a masking layer. Thus, instead of using a conventional gate conductor and the self-alignment of junctions to that conductor, the present process uses a masking layer on the polysilicon surface to instill the junctions.

Broadly speaking, the present invention contemplates a method for interconnecting a first gate conductor of a first transistor to a second gate conductor of a second transistor. The first transistor is defined within a first elevation level, and the second transistor is defined within a second elevation level. The method occurs by forming a silicide upon a first gate conductor of the first transistor. Thereafter, an interlevel dielectric is deposited across the first transistor, including it being deposited across the silicide of the first transistor. Openings are formed through the interlevel dielectric to the silicide which resides on the first transistor gate conductor. The opening is then filled with a second gate conductor attributable to a second transistor. The second gate conductor is a silicon-based material which can be configured to receive a gate dielectric thereon. Thereafter, a substrate (or well) is formed upon the gate dielectric as well as regions laterally adjacent the gate dielectric. The substrate is preferably polysilicon configured to receive source and drain regions attributable to the second transistor. The gate conductor of the second transistor is thereby arranged at an elevation level below the gate dielectric as well as below the source/drain regions of the second transistor.

The present invention further contemplates an integrated circuit. The integrated circuit comprises a first transistor having a first gate conductor arranged upon a first topography. An interlevel dielectric is arranged upon the first gate conductor and the laterally adjacent first topography. A second conductor is formed within an opening through the interlevel dielectric to the upper surface of a silicide-covered first gate conductor. A substrate is then formed a spaced distance above the second gate conductor, and various implant species are forwarded into the substrate to complete a second transistor.

Preferably, the first topography upon which the gate conductor of the first transistor is formed comprises a silicon substrate coated with an oxide of relatively uniform thickness. The interlevel dielectric formed across the gate conductor of the first transistor as well as the lateral first topography may comprise oxide or, more specifically, silicon dioxide in relatively stoichiometric proportions. The gate conductors of the first and second transistors comprise polysilicon, and the silicide preferably formed therebetween comprises a refractory metal annealed into the upper surface of the first transistor gate conductor.

BRIEF DESCRIPTION OF THE DRAWINGS

Other objects and advantages of the invention will become apparent upon reading the following detailed description and upon reference to the accompanying drawings in which.

Figure 1:
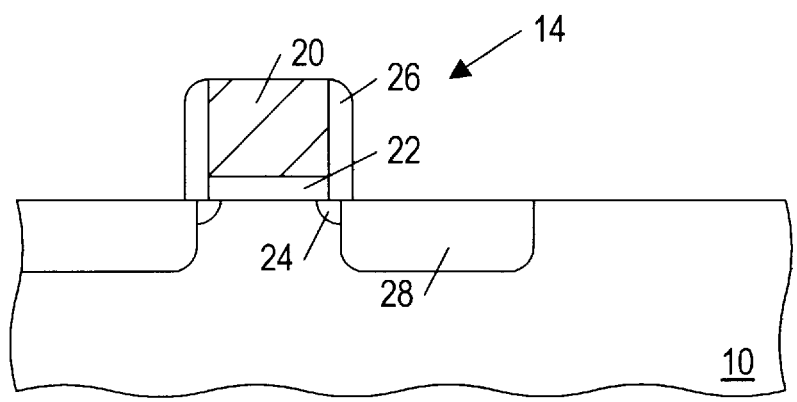
FIG. 1 is a partial cross-sectional view of a semiconductor substrate having a first transistor formed upon and within the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a partial cross-sectional view of a semiconductor substrate 10. Substrate 10 is preferably a silicon-based, single crystalline material doped either n-type or p-type. Arranged on the upper surface of substrate 10 can be various isolation structures (not shown). Isolation structures can be formed either by the shallow trench process or the LOCOS process. In either event, isolation structures serve to isolate an active or passive device in one portion of substrate 10 from an active or passive device within another portion of substrate 10.

An example of one active device formed between isolation structures is provided in reference to numeral 14. Device 14 is shown as a first transistor formed upon and within the upper surface of substrate 10. First transistor 14 includes, according to one embodiment, a gate conductor 20 and a gate dielectric 22. Gate conductor 20, in combination with adjacent isolation structures, serve to mask implant of a lightly doped drain 24 ("LDD") into the regions therebetween. Thereafter, a CVD oxide is deposited across the topography, including the LDD implant areas 24. The CVD oxide is then removed using an anisotropic etch. Resulting from the anisotropic etch, oxide spacers 26 remain on opposing side wall surfaces of conductor 20. Spacers 26, as well as isolation structures, serve to mask implant of source/drain impurities. The source/drain implant 28, in conjunction with LDD implant 24, comprises a junction, wherein the term "junction" connotes either a source region or a drain region.

Figure 2:
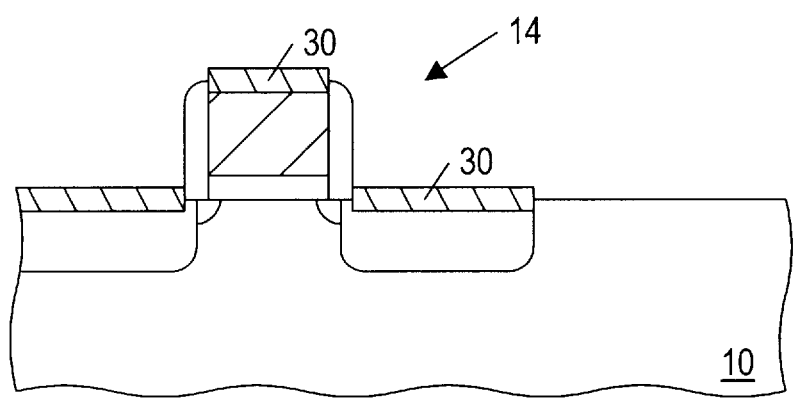
FIG. 2 is a partial cross-sectional view of the semiconductor substrate having silicide formed in silicon-exposed regions according to a processing step subsequent to FIG. 1.

Junction areas serve to receive various silicides shown in reference to FIG. 2. The silicides help reduce contact resistivity of metal conductors forwarded to the junctions. Silicides are shown by reference to as numeral 30, and are formed anywhere where silicon is present. Silicides 30 primarily exist on the silicon-based junctions 28 as well as the polysilicon gate conductor 20. Silicides 30 upon polysilicon are often referred to as "polycide". Regardless of where the silicides are formed, the process sequence used in producing silicide is generally the same. First the silicon-based material receives a refractory metal. Second, the metal covered, silicon-based material is subjected to a high temperature anneal cycle. The anneal cycle allows movement of the silicon and refractory metal atoms so that a metal silicide occurs. The anneal cycle is often repeated to achieve a first phase silicide, followed by a second phase silicide. The second phase silicide is generally of lower resistivity than the first phase silicide. In the interim, however, non-reacted refractory metal is removed from areas typically in regions over oxide.

Figure 3:
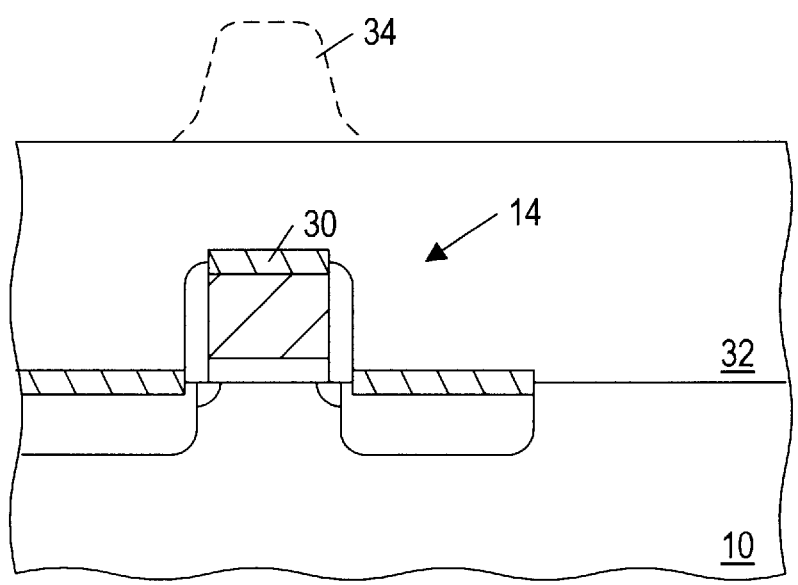
FIG. 3 is a partial cross-sectional view of the semiconductor substrate having an interlevel dielectric placed over the first transistor according to a processing step subsequent to FIG. 2.

Referring to FIG. 3, a processing step subsequent to FIG. 2 is shown. In particular, FIG. 3 illustrates an interlevel dielectric 32 deposited across the first topography onto which, and into which, first transistor 14 resides. Interlevel dielectric 32 can be deposited in numerous ways. Preferably, dielectric 32 is deposited as an oxide using CVD techniques. According to one embodiment, dielectric 32 is deposited using plasma enhanced CVD to a thickness sufficient to isolate transistor 14 from certain devices subsequently placed upon and within dielectric 32. Dielectric 32 is also deposited at a thickness sufficient to define the thickness of a subsequently placed gate conductor attributable to a second level transistor.

In preparation for second level devices, dielectric 32 is preferably planarized after it is deposited. According to one embodiment, peak elevation regions 34 of dielectric 32 are removed by chemical mechanical polishing ("CMP"). CMP utilizes a slurry material and a polishing pad placed on the exposed surface, whereby the pad rotates and removes the upper surfaces commensurate with the lower surfaces. According to another embodiment, the upper surfaces 34 are removed using a sacrificial etch back. In this instance, a sacrificial material is placed on the upper surface such that the recesses or valleys are filled with that material. The material upper surface is then removed at an etch rate substantially the same as the dielectric underlayer. When all of the sacrificial material is removed, the remaining dielectric surface is approximately planar in that it takes on the same contours as the planar surface of the sacrificial material.

Figure 4:
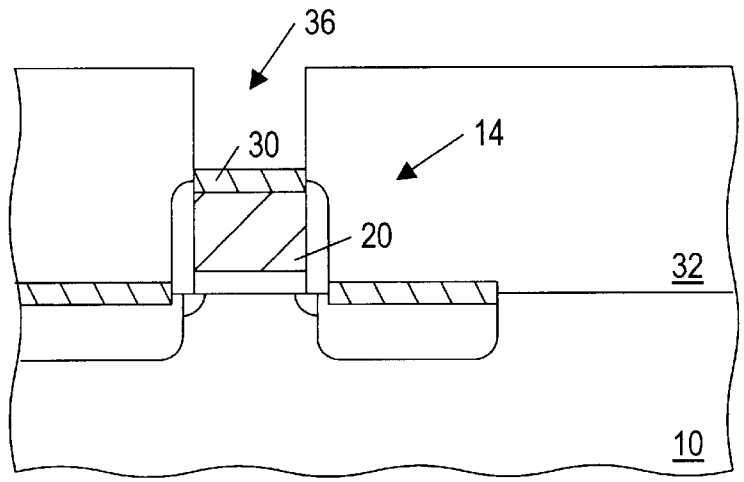
FIG. 4 is a partial cross-sectional view of the semiconductor substrate having an opening formed through the interlevel dielectric to a silicide region formed at the upper surface of the first transistor gate conductor according to a processing step subsequent to FIG. 3.

Referring to FIG. 4, a processing step subsequent to FIG. 3 is shown. FIG. 4 depicts an opening 36 which extends entirely through interlevel dielectric 32 to the upper surface of silicide 30. Opening 36 is contained only to the silicide upon the first transistor gate conductor 20. Opening 36 is produced by placing a masking layer across dielectric 32 and then patterning the masking layer such that the region to be opened is exposed. The exposed region is then subjected to an etch which, according to one embodiment, is a dry (anisotropic) etchant.

The etchant cycle continues for a time sufficient to remove all of interlevel dielectric 32 directly above silicide 30. The etchant composition is chosen so that it is selective to removing dielectric 32 but to a lesser degree silicide 30. Various etchant species used for achieving that purpose are generally well known, all of which achieve a fairly straight side wall surface characteristic of an anisotropic etch.

Figure 5:
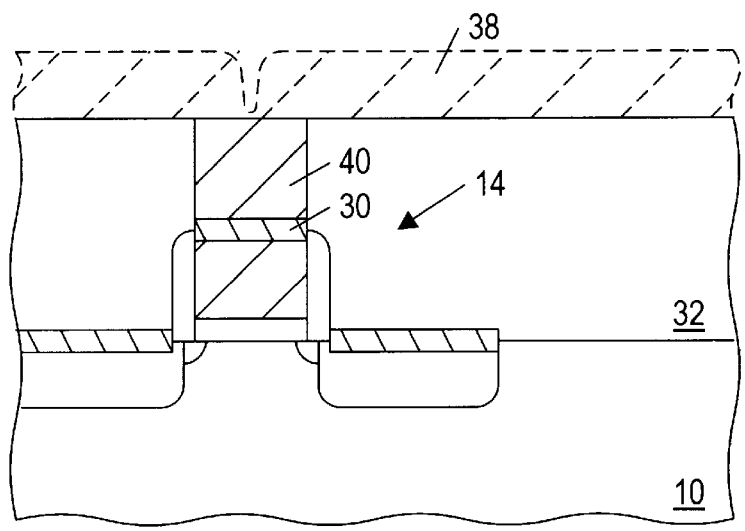
FIG. 5 is a partial cross-sectional view of the semiconductor substrate having polysilicon deposited into the opening and subsequently removed from the interlevel dielectric surface according to a processing step subsequent to FIG. 4.

Referring to FIG. 5, opening 36 is filled with a polycrystalline ("polysilicon") material 38. Polysilicon 38 fills opening 36 by blanket depositing a layer of polysilicon to a thickness which is greater than the depth of opening 36. Thereafter, the upper regions of the polysilicon layer are removed using, for example, CMP. Removal continues for a time sufficient to retain polysilicon 38 only within the confines of opening 36. The retained polysilicon 38 is henceforth referred to as the gate conductor 40 of a second, upper level transistor. After CMP, a blanket implant is performed to dope polysilicon 38 to render it conductive.

Figure 6:
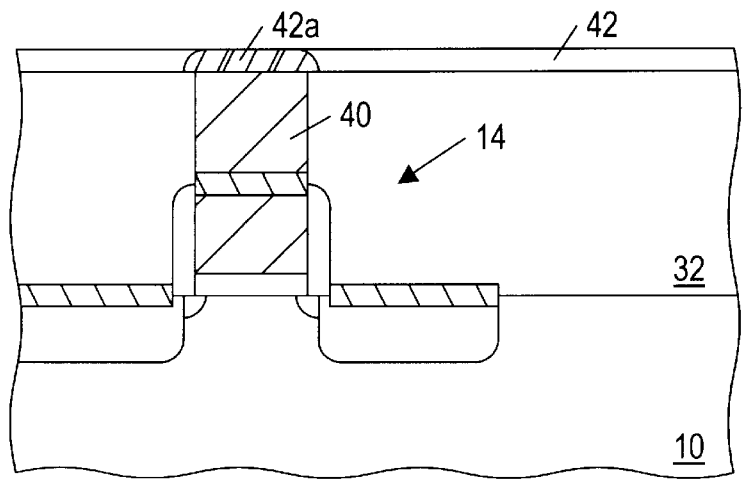
FIG. 6 is a partial cross-sectional view of the semiconductor substrate having a gate dielectric formed upon the retained polysilicon and, if desired, also upon the interlevel dielectric adjacent the retained polysilicon according to a processing step subsequent to FIG. 5.

FIG. 6 illustrates a processing step subsequent to FIG. 5 wherein a dielectric 42 is formed across the upper surfaces of interlevel dielectric 32 and gate conductor 40, according to one embodiment. Dielectric 42 can be CVD deposited. The deposited dielectric may be chosen to contain a nitrogen species. According to another embodiment, dielectric 42 is formed only in regions directly above gate conductor 40. In the later instance, dielectric 42 is denoted as reference numeral 42a, wherein dielectric 42a can be grown from the silicon-based gate conductor 40. Regardless of the method used in producing dielectric 42 and/or 42a, the result is the same: to separate gate conductor 40 from a overlying substrate produced in accordance with the processing step shown in FIG. 7.

Figure 7:
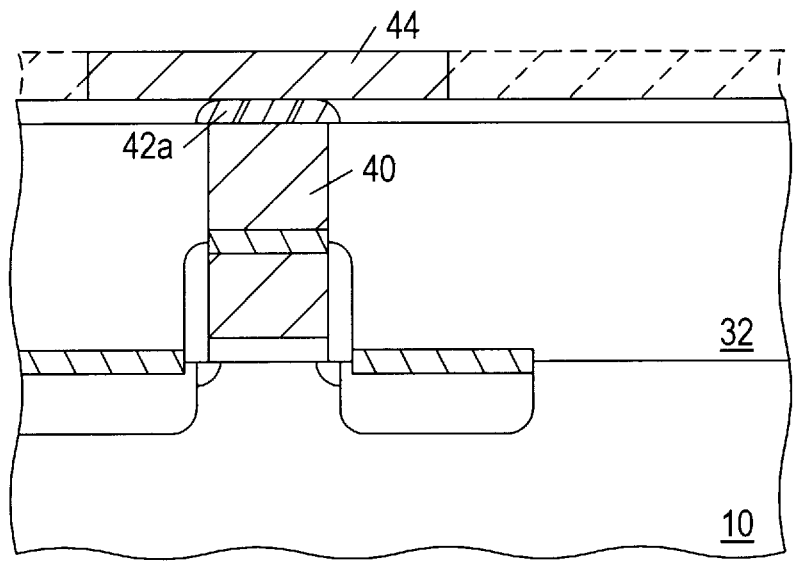
FIG. 7 is a partial cross-sectional view of the semiconductor substrate having a polysilicon substrate formed above the second transistor gate conductor as well as upon regions adjacent the gate conductor according to a processing step subsequent to FIG. 6.

FIG. 7 illustrates a silicon-based substrate 44 formed across only select regions of interlevel dielectric 32. More specifically, substrate 44 is formed by depositing a layer of polysilicon, and then removing portions of that polysilicon except for areas directly above gate conductor 40 and gate dielectric 42a. The retained portions of polysilicon substrate 44 is centered directly above gate conductor 40 and gate dielectric 42, but also extends laterally from the upper surfaces of the gate dielectric. The amount of lateral extension onto adjacent interlevel dielectric 32 can vary. Substrate 44 is defined as having a thickness sufficient to receive source/drain junction implants which extend downward to the bottom surface of substrate 44, or lower. If desired, and it usually is desired, a threshold adjust implant and possibly a punch through implant is incorporated into substrate 44 prior to source/drain formation.

Figure 8:
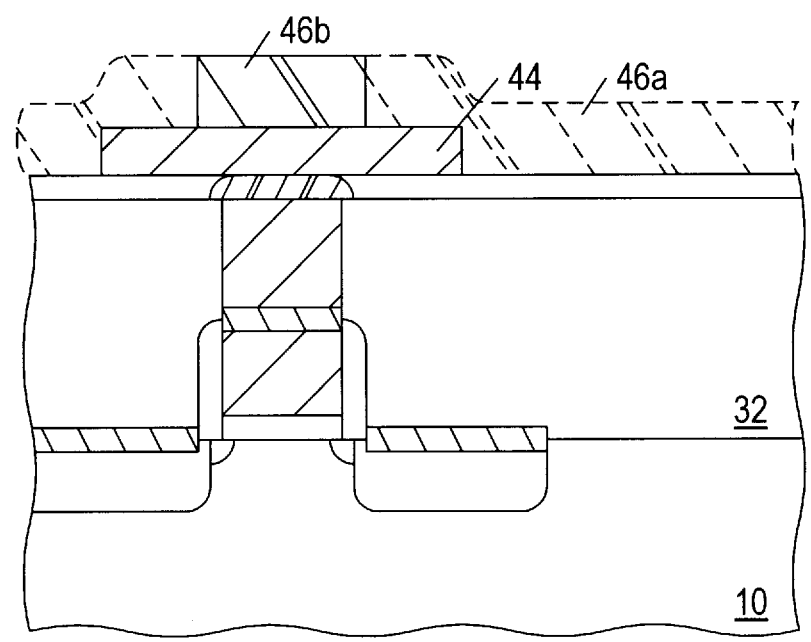
FIG. 8 is a partial cross-sectional view of the semiconductor substrate having a masking material patterned in a limited region near the center of the substrate according to a processing step subsequent to FIG. 7.

FIG. 8 depicts a processing step whereby a masking material 46 is deposited across the entire upper topography. Portions of that masking material are removed, and those portions are designated as reference numeral 46a. The retained portions 46b, however, exist only upon substrate 44. Retained masking material 46b exists only along a center region of substrate 44. The extremities of substrate 44 are thereby exposed as shown in FIG. 9.

Figure 9:
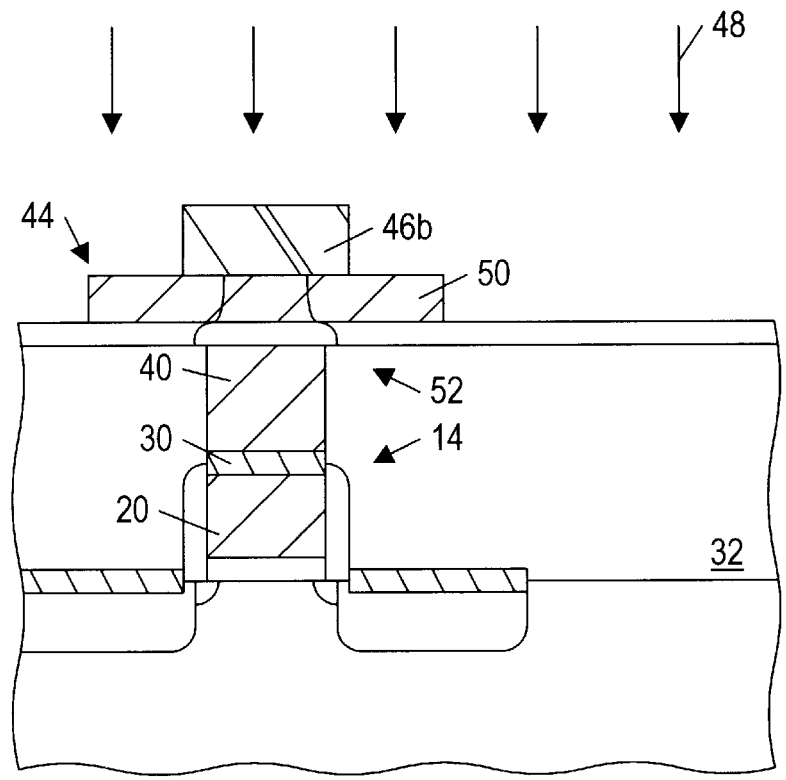
FIG. 9 is a partial cross-sectional view of the semiconductor substrate having implant species forwarded into the substrate in regions void of the masking material to conclude formation of the second transistor according to a processing step subsequent to FIG. 8.

FIG. 9 illustrates a processing step subsequent to FIG. 8, wherein source/drain implants are forwarded into substrate 44 in regions void of retained masking material 46b. Implants 48 extend into substrate 44 and form source/drain junctions 50. Junctions 50, in combination with gate conductor 40 and gate dielectric 42a, comprise a second transistor 52. Second transistor 52 comprises essentially the same features as first transistor 14. However, those features are inverted relative to the order in which features of first transistor 14 are formed. Further, features of second transistor 52 are confined entirely within or below substrate 44.

For sake of clarity, gate conductors 20 and 40 are not drawn to scale. The topological thickness and area of polysilicon which form those conductors can be adjusted depending upon the size of transistors 14 and 52 as well as the thickness of interlevel dielectric 32. It is not imperative that the relative features be drawn to scale or that dimensions be specified, all of which would be readily apparent to those skilled in the art given the benefits described herein. What is necessary, however, is that the second level gate conductor 40 be adjoined with first level gate conductor 20 preferably via silicide 30. Further, the electrical connection between the gate conductors is made in the shortest possible manner. Rather than having to route the gate conductor of one transistor laterally across a topological surface to a gate conductor of another transistor, the gate conductors herein are stacked one upon each other using an inverted second transistor. Connection to the stacked gate conductors is performed in a dimension either behind or in front of the cross-sectional plane shown in FIG. 9.

Substrate 44 of second transistor 52 receives various dopants to render the substrate (or well) semiconductive. Preferably, substrate 44 comprises polysilicon, and polysilicon is exposed along a separate surface to receive all the various implants necessary to form junctions and channels.

Figure 10:
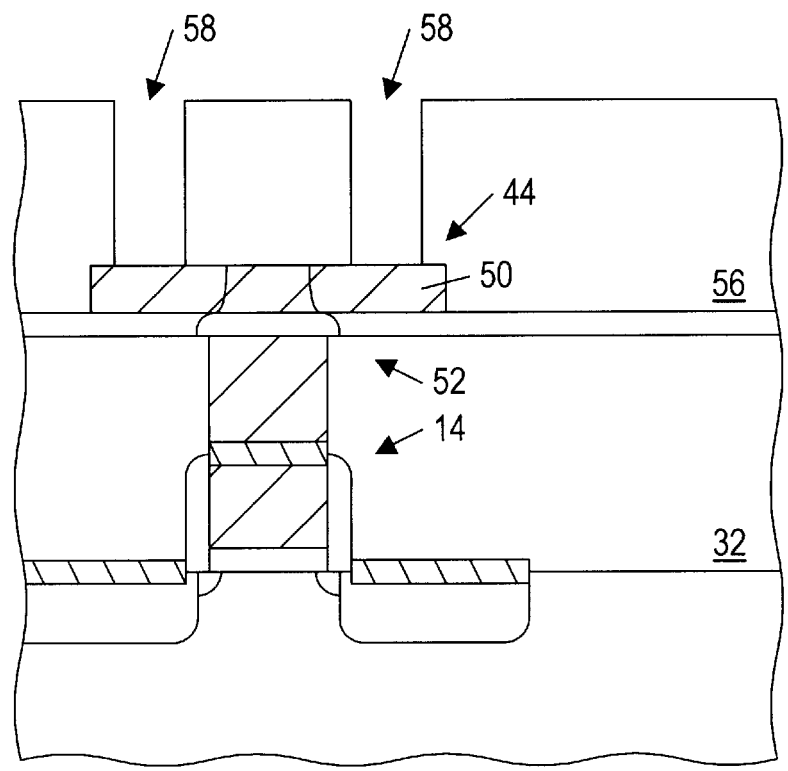
FIG. 10 is a partial cross-sectional view of the semiconductor substrate having the masking material entirely removed and a second interlevel dielectric placed upon and selectively etched from the second transistor substrate according to a processing step subsequent to FIG. 9.

FIG. 10 illustrates a processing step subsequent to FIG. 9 whereby another interlevel dielectric 56 can be fashioned upon second transistor 52 and the lateral topography into which and upon which transistor 52 occurs. Dielectric 56 can be planarized, similar to that used to planarize dielectric 32. Accordingly, dielectric 56 affords an opportunity to introduce openings 58 to source/drain regions 50 within substrate 44. Openings 58 can thereafter be filled (not shown) to accept conductive vias. The conductive vias serve as interconnect which extend along a vertical axis. The interconnect thereby couples the source/drain implants 50 to possibly another level of transistors placed upon dielectric 56 upper surface. Depending upon the number of levels needed, numerous other transistors can therefore be stacked almost endlessly into a third dimension to allow multi-level device fabrication hereof.

It will be appreciated to those skilled in the art having the benefit of this disclosure that the present process methodology is capable of producing p-type and/or n-type devices in three dimensions. Preferably, however, the p-type device is limited to the second transistor and the n-type device is limited to the first transistor, or vice versa. Thus, the first and second transistors are of opposite type so that gate conductor 40 of second transistor 52 is doped opposite gate conductor 20 of first transistor 14. This ensures an ohmic contact at silicide 30. This ohmic contact ensures that both polysilicon gates will be at the same bias—a desired outcome in circuit applications.

If for example, second transistor 52 is a p-type transistor, then implant 48 (shown in FIG. 9) is a p-type implant. Of course, implicit in this implant is the occurrence of dopant placed within second gate conductor 40. This pre-existing dopant within conductor 40 occurs by implanting the conductor after the steps shown in FIG. 5 and before the deposition/growth of oxide shown in FIG. 6.

Various modifications and changes may be made to each and every processing step without departing from the spirit and scope of the invention provided the interconnect concepts set forth in the claims are retained. It is intended that the following claims be interpreted to embrace all such modifications and changes, and accordingly, the specification and drawings are to be regarded in an illustrative rather than a restrictive sense.

What is claimed is:

1. A method for interconnecting a first gate conductor of a first transistor to a second gate conductor of a second transistor, comprising:

forming a suicide upon a first gate conductor of a first transistor;

depositing an interlevel dielectric across said silicide;

forming an opening through said interlevel dielectric to said suicide;

filling said opening with a second gate conductor;

growing a gate dielectric upon said second gate conductor;

depositing a substrate upon said gate dielectric;

patterning the substrate upon said gate dielectric; and implanting source and drain regions into said substrate to form a second transistor having said second gate conductor at an elevation level below said gate dielectric and said source and drain regions.

2. The method as recited in claim 1, wherein said first and second gate conductors each comprise polysilicon separated by said suicide.

3. The method as recited in claim 1, wherein said forming the silicide comprises applying a refractory metal upon said first gate conductor and annealing said refractory metal with said first gate conductor.

4. The method as recited in claim 1, wherein said forming the opening comprises anisotropically etching through said interlevel dielectric.

5. The method as recited in claim 1, wherein said growing the gate dielectric comprises thermally growing an oxide upon said second gate conductor.

6. The method as recited in claim 1, wherein said substrate comprises polysilicon.

7. The method as recited in claim 1, wherein said depositing the substrate comprises depositing polysilicon across said gate dielectric and said interlevel dielectric, and said patterning the substrate comprises removing said polysilicon except for a region directly above said second gate conductor and a lateral distance therefrom.

8. The method as recited in claim 1, further comprising doping said first gate conductor with a first impurity species prior to doping said second gate conductor with a second impurity species of a type opposite said first impurity species.

9. The method as recited in claim 8, wherein said implanting the source and drain regions comprises implanting with said second impurity species.

10. The method as recited in claim 1, further comprising introducing an impurity into said substrate prior to implanting said source and drain regions.

11. The method as recited in claim 1, further comprising introducing an impurity into said second gate conductor prior to depositing said substrate.

12. A method for forming transistors on separate elevation levels and producing interconnection between the gate conductors of said transistors, comprising:

provariding a first transistor having a first gate conductor doped with a first impurity species;

forming a silicide upon said first gate conductor;

depositing an interlevel dielectric upon said silicide;

removing said interlevel dielectric to form an opening along an axis which extends only in a region directly above said silicide;

filling said opening with a second gate conductor doped with a second impurity species of a type opposite said first impurity species;

growing a gate oxide upon said second gate conductor;

patterning a substrate dielectrically above said second gate conductor; and implanting said substrate with said second impurity species in source and drain regions laterally spaced from each other to form a second transistor responsive to voltage upon said second gate conductor.

13. The method as recited in claim 12, wherein said second gate conductor resides at an elevation level below said substrate.

14. The method as recited in claim 12, wherein said implanting the substrate comprises patterning an implant masking material upon said substrate having an area constrained near the center of said substrate.

15. The method as recited in claim 14, wherein said implant masking material is constrained directly above said second gate conductor.

* * * * *

UNITED STATES PATENT AND TRADEMARK OFFICE
CERTIFICATE OF CORRECTION

PATENT NO. : 5,863,818

DATED : January 26, 1999

INVENTOR(S) :
Daniel Kadosh, Mark I. Gardner and Robert Paiz

It is certified that error appears in the above-identified patent and that said Letters Patent is hereby corrected as shown below:

In the Claims:

Claim 1, col. 8, lines 17 and 21, please delete the word "suicide", and insert the word --silicide--.

Signed and Sealed this

Sixth Day of July, 1999

Attest:

Q. TODD DICKINSON

*Attesting Officer*     Acting Commissioner of Patents and Trademarks